United States Patent
Michael et al.

(10) Patent No.: US 10,305,470 B1
(45) Date of Patent: May 28, 2019

(54) CIRCUIT FOR RECOVERING FROM POWER LOSS AND ELECTRONIC DEVICE USING THE SAME CIRCUIT AND METHOD THEREOF

(71) Applicant: Winbond Electronics Corp., Taichung (TW)

(72) Inventors: Oron Michael, San Jose, CA (US); Dae Hyun Kim, San Jose, CA (US)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 16/030,778

(22) Filed: Jul. 9, 2018

(51) Int. Cl.
  *H03K 17/22* (2006.01)
  *H03L 7/00* (2006.01)
  *H03K 19/20* (2006.01)

(52) U.S. Cl.
  CPC ............. *H03K 17/22* (2013.01); *H03K 19/20* (2013.01)

(58) Field of Classification Search
  CPC .............................. H03K 17/22; H03K 19/20
  See application file for complete search history.

(56) References Cited

U.S. PATENT DOCUMENTS

| | | | | |
|---|---|---|---|---|
| 5,787,040 A * | 7/1998 | Leon | ...................... | G11C 5/143 365/195 |
| 6,118,315 A * | 9/2000 | Guedj | .............. | G01R 19/16538 327/143 |
| 6,119,210 A * | 9/2000 | Leon | ...................... | G11C 5/143 711/103 |
| 6,868,500 B1 * | 3/2005 | Kutz | ........................ | G06F 1/24 323/266 |
| 7,200,066 B2 * | 4/2007 | Krenzke | ................ | G11C 5/147 365/189.09 |
| 7,213,120 B2 | 5/2007 | Hotaka | | |
| 8,032,787 B2 * | 10/2011 | Atri | ..................... | G06F 11/1441 714/22 |
| 8,046,634 B2 * | 10/2011 | Kim | ........................ | G06F 11/00 714/23 |
| 8,051,331 B2 * | 11/2011 | Oodate | ................. | G11C 16/20 714/22 |
| 9,329,210 B1 * | 5/2016 | Gupta | ................ | G01R 19/1659 |
| 10,096,371 B2 * | 10/2018 | Park | ..................... | G11C 16/225 |

FOREIGN PATENT DOCUMENTS

| | | |
|---|---|---|
| CN | 102467969 | 5/2012 |
| TW | I536392 | 6/2016 |

* cited by examiner

*Primary Examiner* — Kenneth B Wells
(74) *Attorney, Agent, or Firm* — JCIPRNET

(57) ABSTRACT

In an aspect, the disclosure is directed to a circuit which includes not limited to a memory circuit which includes a first memory element outputting a first memory output voltage and a second memory element outputting a second memory output voltage; a logical comparator circuit which is connected to the memory circuit and includes a first logical comparator which compares the first memory output voltage with a first power supply voltage to generate a first logical comparator output voltage and a second logical comparator which compares the second memory output voltage with a second power supply voltage to generate a second logical comparator output voltage; and a logical circuit which is electronically connected to the logical comparator circuit and receives a first logical comparator output voltage and a second logical comparator output voltage to perform a first logical operation which is used at least in part to generate a power on reset voltage.

20 Claims, 7 Drawing Sheets

CIRCUIT FOR RECOVERING FROM POWER LOSS AND ELECTRONIC DEVICE USING THE SAME CIRCUIT AND METHOD THEREOF

TECHNICAL FIELD

The disclosure is directed to a circuit for recovering from power loss, an electronic device using the same circuit, and a method thereof.

BACKGROUND

A power loss test could be one of the tests that a manufactured chip or integrated circuit (IC) is required to pass when the chip is being evaluated on an assembly line or in a laboratory. For example, a mobile phone that runs on batteries may undergo such test. When a chip experiences a sudden power loss from an internal or external power supply, the power level may decrease gradually to a certain level but not all the way to zero such that a power on reset (POR) may not be triggered to generate a reset signal to reset the power supply circuit of a chip. If the POR is not triggered to reset the chip, memory elements could be in an unknown state.

As seen from FIG. 1, after a POR 101 has been triggered, the power supply of a chip may go from 0 volt to VCC, a normal bias voltage. However, suppose that the power supply of the chip suddenly drops as shown in the power loss area 102, the memory elements of the chip may enter an unknown state if the power supply drops to a voltage that is below a minimum threshold but not quite reaching about 0 volt to trigger a POR as shown in the dead zone area 103. The dead zone area 103 refers to the range of power supply voltage within which the memory elements would not be guaranteed to keep their recorded states but at the same time a POR would not be triggered.

The reason that the chip would likely be in an unknown state is due to memory elements losing their recorded states loss when power supply level drops too low. When power supply level drops to the dead zone area 103, memory elements such as flip flops, latches, and so forth may not be able to keep their recorded states and thus causing the chip to enter into an unknown state. After the chip entering into an unknown state, the chip would likely malfunction since the state machine would be unable to proceed to the intended states. Therefore, a chip entering into an unknown state caused by the power supplying entering into the dead zone area 103 could be an issue that needs to be addressed.

SUMMARY OF THE DISCLOSURE

The disclosure is directed to a circuit for recovering from power loss, an electronic device using the same circuit, and a method thereof.

In an aspect, the disclosure is directed to a circuit for recovering from power loss, the circuit would include not limited to: a memory circuit which includes a first memory element outputting a first memory output voltage and a second memory element outputting a second memory output voltage; a logical comparator circuit which is electrically connected to the memory circuit and comprises a first logical comparator which compares the first memory output voltage with a first power supply voltage to generate a first logical comparator output voltage and a second logical comparator which compares the second memory output voltage with a second power supply voltage which is high than the first power supply voltage to generate a second logical comparator output voltage; and a logical circuit which is electronically connected to the logical comparator circuit and receives a first logical comparator output voltage and a second logical comparator output voltage to perform a first logical operation which is used at least in part to generate a power on reset voltage.

In an aspect, the disclosure is directed to an electronic device which would include not limited to: a power supply circuit; and an electrical circuit electrically connected to the power supply circuit for recovering from a power loss caused by an output voltage drop from the power supply circuit, wherein the electronical circuit includes: a memory circuit which has at least a first memory element outputting a first memory output voltage and a second memory element outputting a second memory output voltage; a logical comparator circuit which is electrically connected to the memory circuit and includes a first logical comparator which compares the first memory output voltage with a first power supply voltage received from the power supply circuit to generate a first logical comparator output voltage and a second logical comparator which compares the second memory output voltage with a second power supply voltage, which is received from the power supply circuit and is higher than the first power supply voltage, to generate a second logical comparator output voltage; and a logical circuit which is electronically connected to the logical comparator circuit and receives a first logical comparator output voltage and the second logical comparator output voltage to perform a first logical operation which is used at least in part to generate a power on reset voltage that resets the power supply circuit in response to the output voltage drop from the power supply circuit.

In an aspect, the disclosure is directed to a method used by an electronic device for recovering from power loss, the method would include not limited to: receiving from a first memory element a first memory output voltage and from a second memory element a second memory output voltage; comparing the first memory output voltage with a first power supply voltage received from the power supply circuit to generate a first logical comparator output voltage; comparing the second memory output voltage with a second power supply voltage, which is received from the power supply circuit and is higher than the first power supply voltage, to generate a second logical comparator output voltage; performing a first logical operation by using the first logical comparator output voltage and the second logical comparator output voltage; and generating a power on reset voltage based at least in part on the first logical operation for resetting the power supply in response to the power loss of the power supply.

In order to make the aforementioned features and advantages of the disclosure comprehensible, exemplary embodiments accompanied with figures are described in detail below. It is to be understood that both the foregoing general description and the following detailed description are exemplary, and are intended to provide further explanation of the disclosure as claimed.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DETAILED DESCRIPTION OF DISCLOSED EMBODIMENTS

Reference will now be made in detail to the present exemplary embodiments of the disclosure, examples of which are illustrated in the accompanying drawings.

In this disclosure, a method and a circuit suitable for an electronic device to detect the above described dead zone area 103 and to recover from an unknown memory element state caused by the dead zone area 103 back to a known memory element state is to be described. When the dead zone area 103 has been detected, a power on reset (POR) will be issued to reset the power supply of the electronic device in order to revert back into the known state. One technique to detect the dead zone area 103 would include comparing expected values loaded into memory elements with the power supply's voltage values which are predetermined.

During the power-up state, values from a non-volatile memory will be loaded into memory elements. These values are called DZD pattern, and these values are analog voltages which could be, for example, a high voltage, a low voltage, or a bandgap voltage used for testing power supply voltages with a comparator. The memory elements could be, for example, latches, flip-flops, dummy memories, and etc. The above described DZD pattern could either be hard-wired inside an IC or loaded from an external source into the IC. After a power-up sequence has been completed, the values from the memory element value would then be compared with a power supply's voltages which could be pre-determined values. In a normal operating state, these values will be matched by comparators to generate a matching result, and the result of the match would not trigger the POR. In the event of a power loss and/or memory element losing values, when the voltage of the power supply recovers, the result of the match would likely trigger the POR. After a POR has been triggered, a power up sequence will be initiated.

Figure 1:
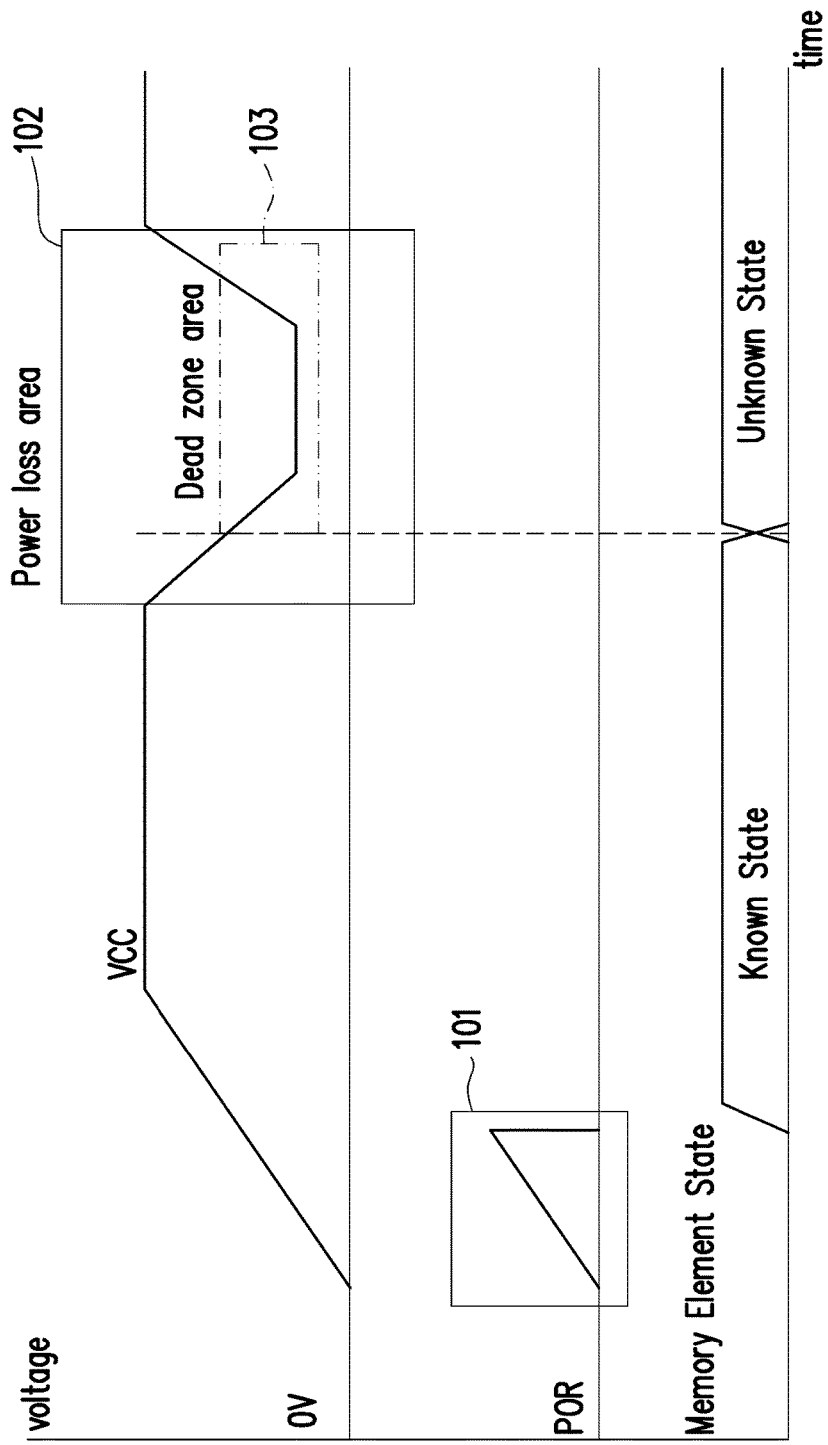
FIG. 1 illustrates the phenomenon of the occurrence of a "dead zone" area which may cause a chip to malfunction.
Figure 2:
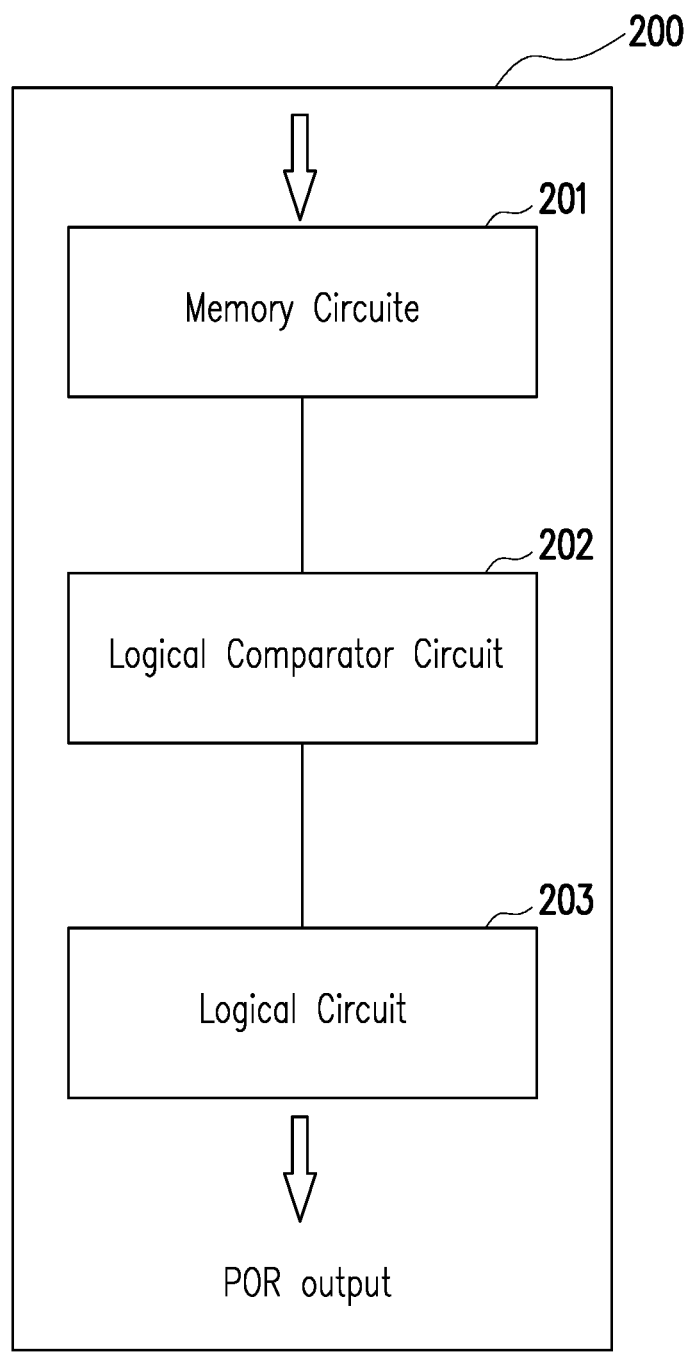
FIG. 2 illustrates the hardware of an electrical circuit for recovering from a power loss of a power supply within the electronic device in terms of a block diagram.
Figure 3:
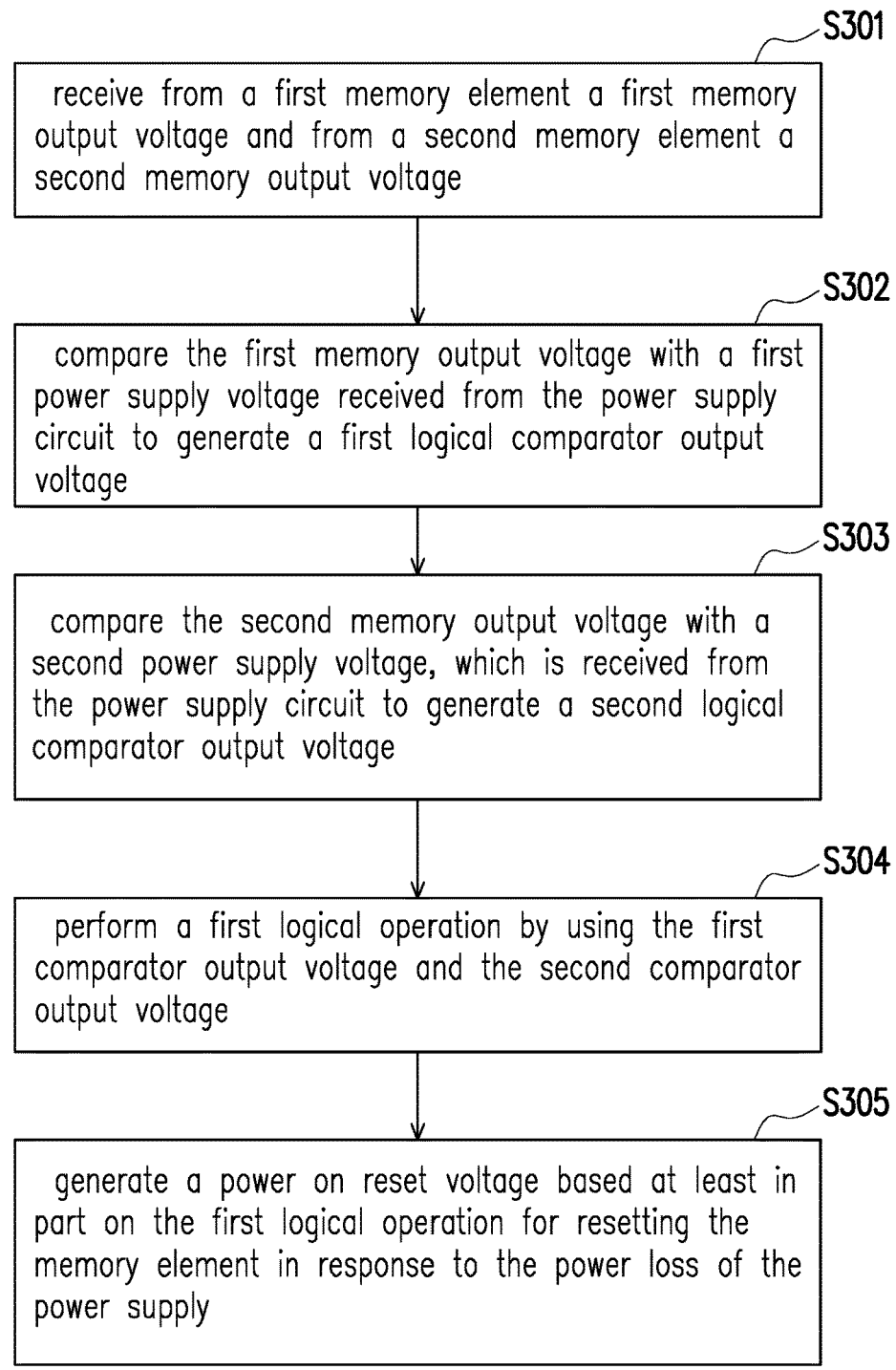
FIG. 3 illustrates a method used by an electronic device for recovering from a power loss of a power supply as described in this disclosure.

In an aspect, the disclosure provides an electrical circuit which would address the above described issue of recovering from a power loss caused by an output voltage drop from the power supply circuit. Referring to FIG. 2, the electrical circuit would be electrically connected to a power supply circuit, and the electrical circuit and the power supply circuit could both be disposed within an electronic device. The electrical circuit 200 would include not limited to a memory circuit 201, a logical comparator circuit 202, a logical circuit 203 which outputs a POR signaling line, and etc.

The memory circuit 201 may include not limited to a first memory element outputting a first memory output voltage and a second memory element outputting a second memory output voltage. The logical comparator circuit which is electrically connected to the memory circuit 201 may include not limited to a first logical comparator which compares the first memory output voltage with a first power supply voltage received from a power supply circuit to generate a first logical comparator output voltage and a second logical comparator which compares the second memory output voltage with a second power supply voltage, which is received from the power supply circuit to generate a second logical comparator output voltage. The logical circuit 203 which is electronically connected to the logical comparator circuit 202 would receive a first logical comparator output voltage and the second logical comparator output voltage to perform a first logical operation which is used at least in part to generate a power on reset (POR) voltage that resets the memory circuit in response to the output voltage drop from the power supply circuit.

In one of the exemplary embodiments, the first memory output voltage has an opposite binary value from the second memory output voltage as the first memory output voltage and the second memory output voltage causes the first logical comparator output voltage and the second logical comparator output voltage to output a same first binary value when the power supply operates normally without the power loss. But when the power supply experiences the power loss caused by the output voltage drop from the power supply circuit, at least one of the first logical comparator output voltage and the second logical comparator output voltage outputs a second binary value which is opposite to the first binary value.

In one of the exemplary embodiments, the first logical operation could be a NAND operation performed by a first logical operating circuit which outputs the second binary value when the power supply operates normally without the power loss but outputs the first binary value when the power supply experiences the power loss caused by the output voltage drop from the power supply circuit.

In one of the exemplary embodiments, the logical comparator circuit 202 may further include not limited to a third logical comparator which compares a third memory output voltage with the first power supply voltage received from the power supply circuit to generate a third logical comparator output voltage, a fourth logical comparator which compares a fourth memory output voltage with the second power supply voltage to generate a fourth logical comparator output voltage, and a second logical operating circuit which receives the third logical comparator output voltage and the fourth logical comparator output voltage to perform a second logic operation which, for example, could be a NAND operation on the third logical comparator output voltage and the fourth logical comparator output voltage.

In one of the exemplary embodiments, the logical circuit 203 may further include not limited to a third logical operating circuit which receives the NAND operation of the first logical operating circuit and also the NAND operation of the second logical operating circuit to perform a third logical operation to generate the power on reset (POR) voltage.

In one of the exemplary embodiments, the first memory element of the memory circuit 201 could be a dummy memory element which is used exclusively by the electrical circuit (i.e. not used as general purpose storage medium used by a processor, controller, and etc.). Alternatively, the first memory element could be a first SR flip-flop which is set by a power on reset and the second memory element could be a second SR flip-flop which is reset by a power on reset.

The disclosure also provides a method used by an electronic device having the electrical circuit 200 for recovering from a power loss of a power supply as described in this disclosure. The method would include but not limited to the steps to be described as follows. In step S301, an electrical circuit may receive from a first memory element a first memory output voltage and from a second memory element a second memory output voltage. In step S302, the electrical circuit may compare the first memory output voltage with a first power supply voltage received from the power supply circuit to generate a first logical comparator output voltage. In step S303, the electrical circuit may compare the second memory output voltage with a second power supply voltage, which is received from the power supply circuit to generate a second logical comparator output voltage. In step S304, the electrical circuit may perform a first logical operation by using the first logical comparator output voltage and the second logical comparator output voltage. In step S305, the electrical circuit may generate a power on reset voltage based at least in part on the first logical operation for resetting the memory circuit in response to the power loss of the power supply.

In one of the exemplary embodiments, the first memory output voltage may have an opposite binary value from the second memory output voltage as the first memory output voltage and the second memory output voltage causes the first logical comparator output voltage and the second logical comparator output voltage to output a same first binary value when the power supply operates normally without the power loss. When the power supply experiences the power loss caused by the output voltage drop from the power supply circuit, at least one of the first logical comparator output voltage and the second logical comparator output voltage may output a second binary value which is opposite to the first binary value.

In one of the exemplary embodiments, the first logical operation could be a NAND operation which outputs the second binary value when the power supply operates normally without the power loss but outputs the first binary value when the power supply experiences the power loss caused by the output voltage drop from the power supply circuit.

Figure 4:
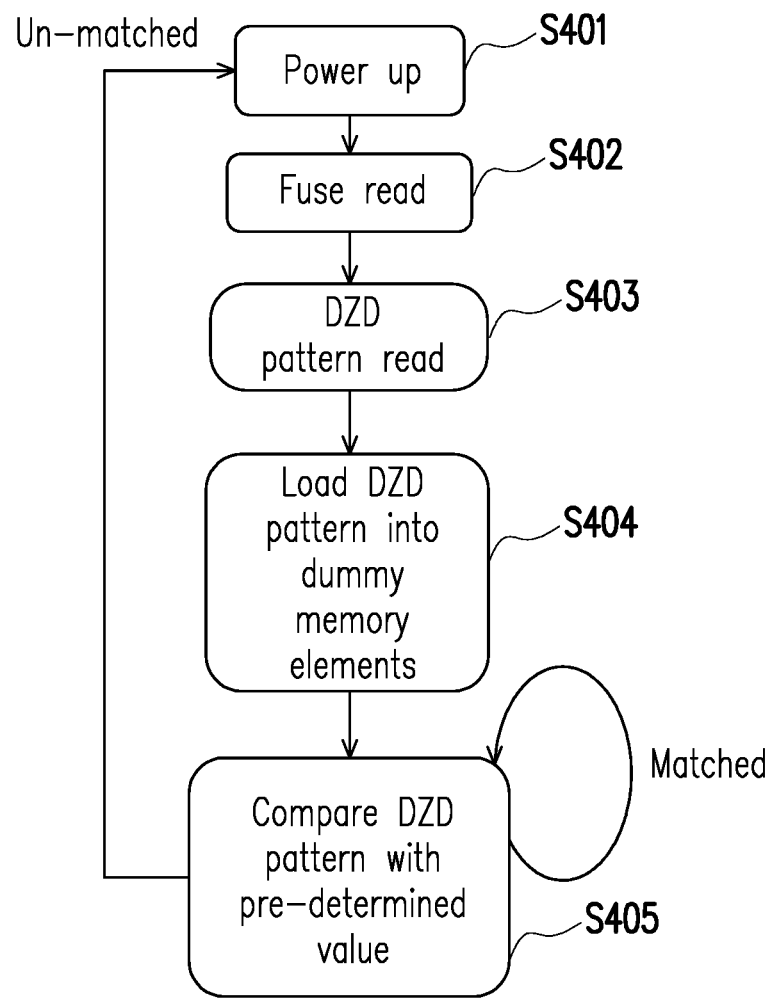
FIG. 4 illustrates an exemplary embodiment of the method used by an electronic device for recovering from a power loss of a power supply
Figure 5:
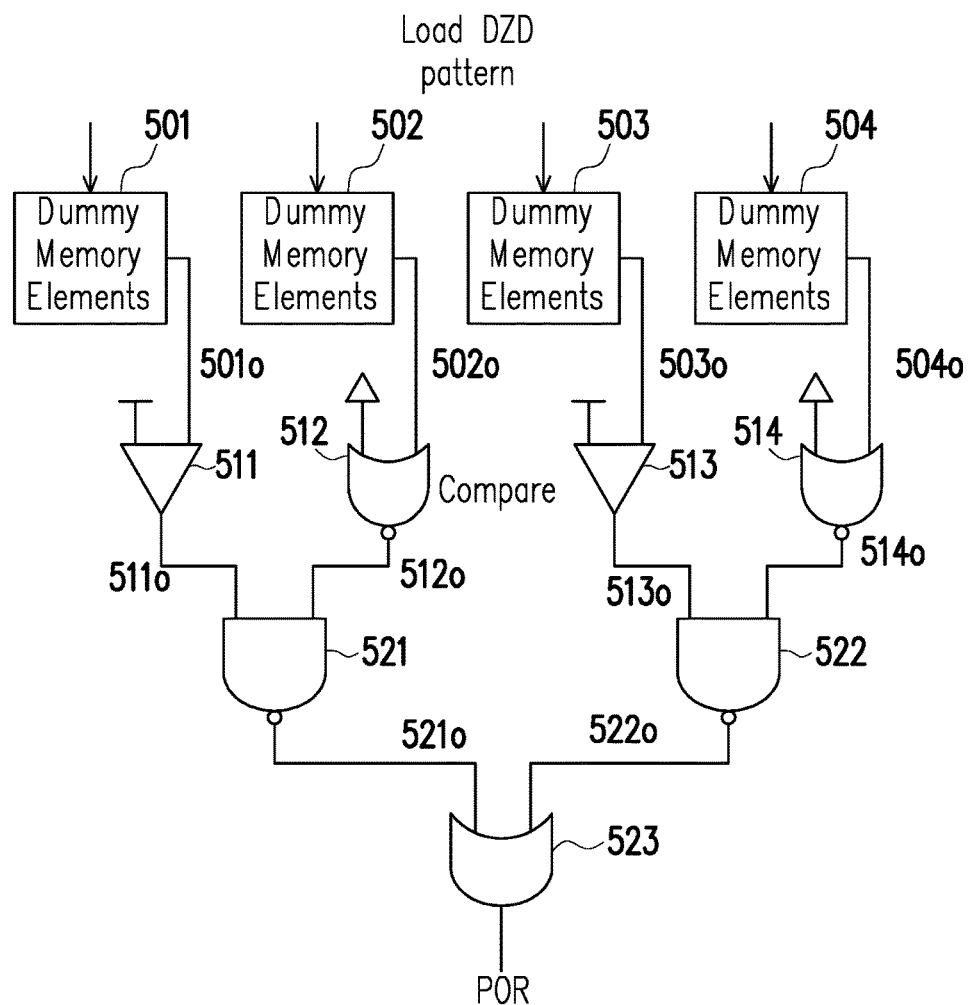
FIG. 5 illustrates a circuit for recovering from a power loss of a power supply within the electronic device with further details in accordance with one of the exemplary embodiments of the disclosure.
Figure 6:
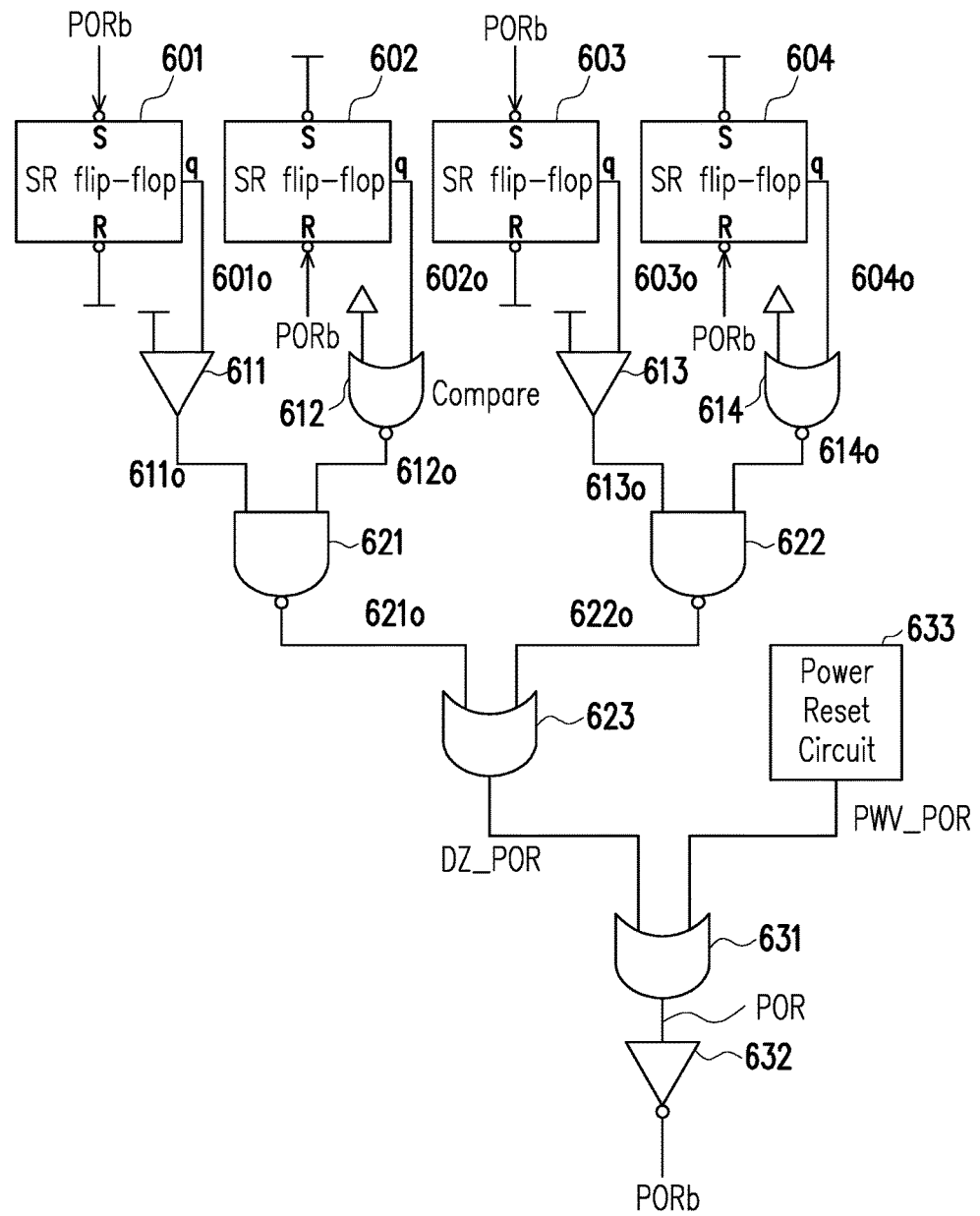
FIG. 6 illustrates another circuit for recovering from a power loss of a power supply within the electronic device in accordance with one of the exemplary embodiments of the disclosure.

To further elucidate the above described concepts, the disclosure provides several exemplary embodiments as disclosed in FIG. 4~FIG. 6 and their corresponding written descriptions. The method may include but not limited to the steps to be described as follows. In step S401, an electronic device would perform a power up operation which may include turning on the electronic device, waking up the electronic device from a sleep mode, and etc. In step S402, the electronic device may optionally perform a fuse read operation which would allow the electronic device to procure a DZD pattern to be used for comparison. In step S403, the electronic device would obtain the DZD pattern. The DZD pattern could be obtained from the fuse read in step S402. Alternatively, the DZD pattern may pre-exist as it could be hardwired into electrical circuits or memory elements of the electronic device. Further, DZD pattern may instead be obtained from an external source such as a central processing unit (CPU) or an external controller. In step S404, once the DZD pattern has been obtained, the electronic device would load the DZD pattern into memory elements such as dummy memory elements, latches, flip-flops, and so forth. Alternatively, the DZD pattern may pre-exist in the memory elements or be programmed into memory elements from an external source. In step S405, the electronic would compare the DZD pattern with pre-determined voltage values from a power supply by one or more comparators to generate a POR signaling. The comparison would be continuous as the circuit would keep monitoring for the dead zone area 103. Once the comparison between the DZD pattern and the pre-determined voltage values from a power supply does not generate expected value(s), the POR reset would be triggered as the process would continue at step S401.

Referring to FIG. 5, the circuit may include not limited to a plurality of memory elements 501~504 which are part of the memory circuit 201, a plurality of comparators 511~514 which are part of the logical comparator circuit 202, and a plurality of logic gates 521~523 which are part of the logical circuit 203. The logical circuit would be configured to generate the POR in response to power supply voltages dropping below a specific threshold (i.e. the dead zone area 103).

The plurality of memory circuits 501~504 could be dummy memory elements which means that the dummy memory elements are not used as actual memory but are used exclusively by the circuit of FIG. 5 to store the DZD pattern to be used for the subsequent comparison. The dummy memory elements would include a first memory element 501 outputting a first memory output voltage 501$o$, a second memory element 502 outputting a second memory output voltage 502$o$, a third memory element 503 outputting a third memory output voltage 503$o$, and a fourth memory element 504 outputting a fourth memory output voltage 504$o$. The DZD pattern, in this exemplary embodiment, could be a sequence of voltages of high low high low (e.g. 1 0 1 0) which is loaded into the dummy memory elements 501~504 respectively, but it should be noted that the disclosure is not limited to this particular set of sequence. Thus, the output voltages 501$o$, 502$o$, 503$o$, and 504$o$ would be high low high low (e.g. 1 0 1 0) respectively.

The logical comparator circuit (202) which is electrically connected to the memory circuit 201 may include not limited to a first logical comparator 511 which compares the first memory output voltage 501$o$ with a first power supply voltage (e.g. ground or Vss) received from a power supply circuit to generate a first logical comparator output voltage 511$o$, a second logical comparator 512 which compares the second memory output voltage 502$o$ with a second power supply voltage (e.g. Vcc), which is received from the power supply circuit and is higher than the first power supply voltage (e.g. ground or Vss), to generate a second logical comparator output voltage 512$o$, a third logical comparator 513 which compares the third memory output voltage 503$o$ with a first power supply voltage (e.g. ground or Vss) received from a power supply circuit to generate a third logical comparator output voltage 513$o$, and a fourth logical comparator 514 which compares the fourth memory output voltage 504$o$ with the second power supply voltage (e.g. Vcc) to generate a fourth logical comparator output voltage 514$o$.

Second logical comparator 512 for example, could be a NOR gate which compares the second memory output voltage 502$o$ with a second power supply voltage (e.g. Vcc) by performing a NOR operation to generate a second logical comparator output voltage 512$o$. Similarly, the Fourth logical comparator 512 could be a NOR gate which compares the fourth memory output voltage 504o with a fourth power supply voltage (e.g. Vcc) by performing a NOR operation to generate a forth logical comparator output voltage 514o.

The comparators 511~514 would generate either a high voltage or a low voltage based on a result of a comparison. It should be noted that the actual voltage level used as the high voltage or the low voltage output by the comparators (511~514) may not necessarily be the same as the high voltage and low voltage of the dummy memory elements (501~504). Under a normal operating condition, the first logical comparator output voltage 511o could configured as a high voltage (e.g. 1) since the comparison result between the first memory output voltage 501o and the first power supply voltage (e.g. ground or Vss) is configured to generate a high voltage. The second logical comparator output voltage 512o could be configured as a high voltage (e.g. 1) since the comparison result between the second memory output voltage 502o and the second power supply voltage (e.g. Vcc) could be configured to generate a high voltage. The third logical comparator output voltage 513o could configured as a high voltage (e.g. 1) since the comparison result between the third memory output voltage 503o and the first power supply voltage (e.g. ground or Vss) could be configured to generate a high voltage. The fourth logical comparator output voltage 514o is configured to be a high voltage (e.g. 1) since the comparison result between the fourth memory output voltage 504o and the second power supply voltage (e.g. Vcc) could be configured to generate a high voltage. It should be noted that since the DZD pattern is programmable, the actual logic gates and output values could be arbitrary.

In one of the exemplary embodiments, assuming that the DZD pattern is 1010, then the first logical comparator 511 could be an AND gate, the second logical comparator 512 could be an NOR gate, the third logical comparator 513 could be an AND gate, and the fourth logical comparator 514 could be an NOR gate. For instance, under a normal operating condition, the first memory output voltage 501o would output a high voltage (e.g. 1) and thus the first logical comparator output voltage 511o would also output a high voltage. However, assuming that the dead zone phenomenon has occurred to result in the first memory output voltage 501o to output a low voltage, then the first logical comparator output voltage 511o would also be a low voltage.

Also for instance, under a normal operating condition, the second memory output voltage 502o is assumed to be configured to output a low voltage, and thus the second logical comparator output voltage 512o which came out of a NOR gate as the result of comparing with a reference voltage (e.g. low voltage) would also output a high voltage. However, assuming that an abnormal operating condition has occurred to result in the second memory output voltage 501o to output a high voltage, then the second logical comparator output voltage 512o would also be a low voltage. The third logical comparator circuit 513 and the fourth logical comparator circuit 514 would operate in a similar manner as the first logical comparator circuit 511 and the second logical comparator circuit 512 respectively.

However, in a power loss event during which a dead zone area has occurred, the voltage of the Vcc would drop but not quite reaching zero. The drop of the Vcc would cause at least the second power supply voltage (e.g. Vcc) in the second logical comparator 512 to drop in voltage such as the comparison result with the second memory output voltage 502o may generate a low voltage (e.g. 0). Similarly, the drop of the Vcc would cause at least the second power supply voltage (e.g. Vcc) in the fourth logical comparator 514 to drop in voltage such as the comparison result with the fourth memory output voltage 504o may generate a low voltage (e.g. 0). Moreover, since the power loss may cause the voltages in the dummy memory elements 501~504 to be unstable, the comparison results of the first logical comparator 511 and the third logical comparator 513 may also not generate the expected result of the high voltage (e.g. 1) but may instead output a low voltage (e.g. 0).

The logical circuit 203 may include a first logical operating circuit 521, a second logical operating circuit 522, and a third logic operating circuit 523. In this exemplary embodiment, the first logical operating circuit 521 and the second logic operating circuit 522 are both circuits which can perform a NAND operation such as a NAND gate, and the third logical operating circuit 523 is a circuit which can perform an OR operation such as an OR gate. Under the normal operating circumstance, the first logical operating circuit output 521o would be a low voltage (e.g. 0) since both first logical comparator output voltage 511o and second logical comparator output voltage 512o are high voltages, and the second logical operating circuit output 522o would also be a low voltage (e.g. 0) since both third logical comparator output voltage 513o and second logical comparator output voltage 514o are high voltages.

However, under an abnormal operating circumstance such as when the dead zone area 103 has occurred, at least one or more of the comparator output voltages 511o, 512o, 513o, 514o could be a low voltage. As long as any one of the output voltages 511o, 512o, 513o, 514o could is a low voltage, then at least one of the first logical operating circuit output 521o and second logical operating circuit output 522o would be a high voltage because of the operating principle of a NAND gate. As long as any one of the first logical operating circuit output 521o and second logical operating circuit output 522o is a high voltage, output of the third logical operating circuit 523 would be a high voltage because of the operating principle of a OR gate. The high voltage of the third logical operating circuit 523 would trigger a POR.

Conceptually, the first memory output voltage 501o has an opposite binary value from the second memory output voltage 502o as the first memory output voltage 501o and the second memory output voltage 502o causes the first logical comparator output voltage 511o and the second logical comparator output voltage 512o to output a same high voltage when the power supply operates normally without the power loss. But when the power supply experiences the power loss caused by the output voltage drop from the power supply circuit, at least one of the first logical comparator output voltage 501o and the second logical comparator output voltage 502o would outputs a low voltage. Any of the comparators 511~514 outputting a low voltage would be processed by the logical circuit 203 to trigger a POR.

In one of the exemplary embodiments, as an alternative to the memory elements 501~504 being dummy memory elements, the memory elements could be other types of memory elements such as a latch, a flip-flop, and etc. Referring to FIG. 6, the memory elements could be implemented by using multiple SR flip-flops which may include not limited to a first SR flip-flop 601 which receives a first voltage of the DZD pattern from a S terminal of the first SR flip-flop and a second SR flip-flop 602 which receives a second voltage of the DZD pattern from a R terminal of the second SR-flip-flop (e.g. 602). FIG. 6 also shows a third SR flip-flop and a fourth SR flip-flop which are identical to the first SR flip-flop 601 and the second SR flip-flop 602. In this way, the DZD pattern could be received externally and programmed into the SR flip-flops according to the typical operating principle of the SR flip-flops. The operating principle of the rest of FIG. 7 would be same as FIG. 6 as a DZ_POR terminal of FIG. 6 would trigger a POR upon the switching of the polarity of the DZ_POR output.

Figure 7:
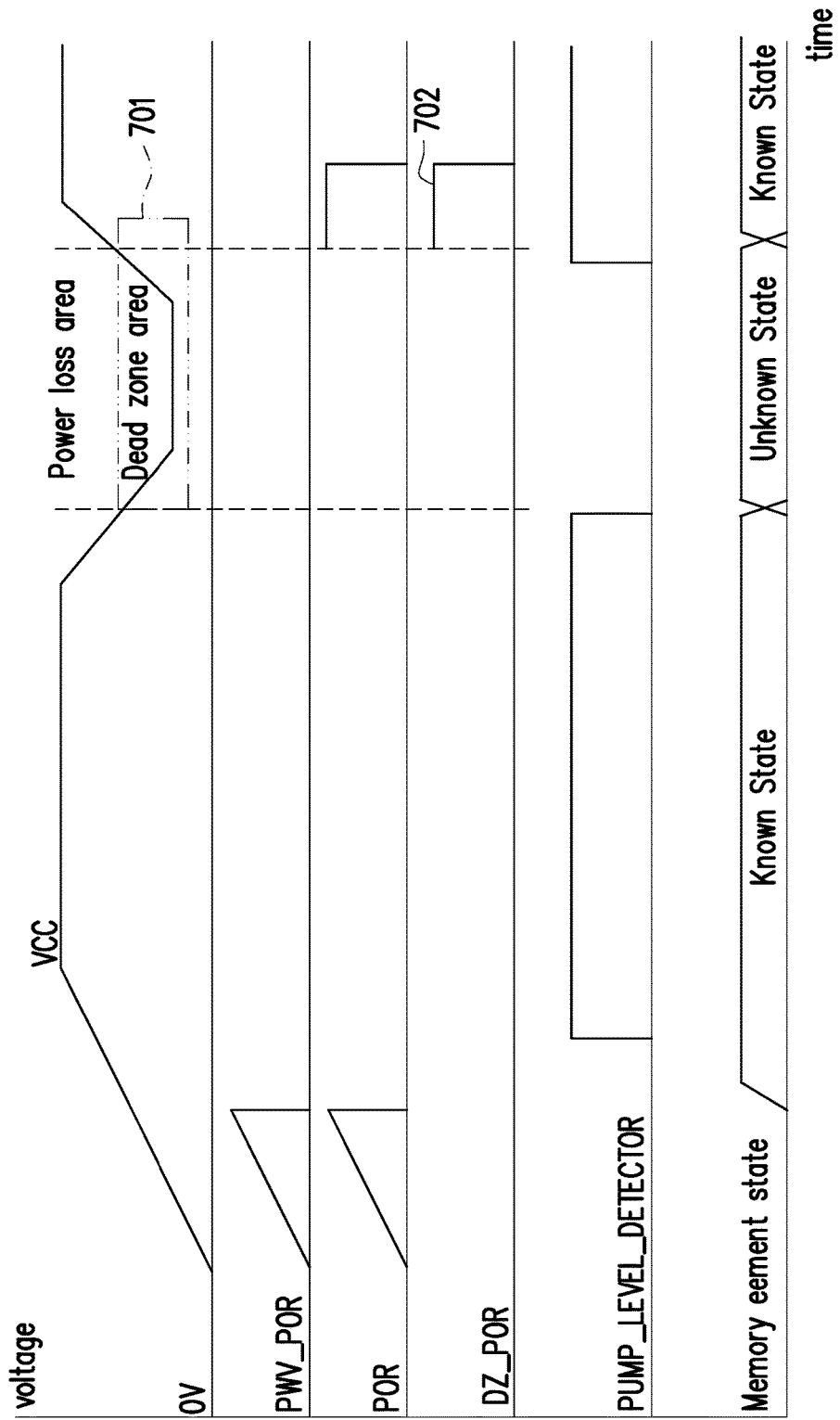
FIG. 7 illustrates a plot which shows moving the memory state of an electronic device from an unknown state back to a known state by using the circuit of FIG. 6 in accordance with one of the exemplary embodiments of the disclosure.

FIG. 7 shows that under a normal operating circumstance, the memory element state of an electronic device should be in a known state. However, when a dead zone area has occurred, the memory element state of an electronic device may fall into an unknown state. By using the circuits of FIG. 6, as the Vcc of the power supply of an electronic device has recovered back to a particular level, the output of the POR signaling line (DZ_POR) would switch polarity so as to trigger a POR 702. After the POR 702 has occurred, the memory element state of the electronic device would revert back to a known state.

In view of the aforementioned descriptions, the disclosure is suitable for being used in an electronic device and is able to detect a power loss condition so as to generate a power on reset during the power loss condition in order to change the memory element state of the electronic device from an unknown state to back to a known state. By using this invention, an electronic device (1) could recover from an unknown state when the power supply falls below a certain level into a "dead zone area" (2) could be monitor and detect a power loss by comparing output voltages of memory elements (3) will increase application reliability, in particular mobile applications, in the event of a power loss (4) may have added security by generating a chip reset in the case of a hacker trying to put an IC chip in an unknown state in order to attack it (5) and would save power as the design as provided uses less power than a an accurate VCC level detector.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An electronic device comprising:
   a power supply circuit; and
   an electrical circuit electrically connected to the power supply circuit for recovering from a power loss caused by an output voltage drop from the power supply circuit, wherein the electrical circuit comprises:
     a memory circuit which comprises a first memory element outputting a first memory output voltage and a second memory element outputting a second memory output voltage;
     a logical comparator circuit which is electrically connected to the memory circuit and comprises a first logical comparator which compares the first memory output voltage with a first power supply voltage received from the power supply circuit to generate a first logical comparator output voltage and a second logical comparator which compares the second memory output voltage with a second power supply voltage, which is received from the power supply circuit to generate a second logical comparator output voltage; and
     a logical circuit which is electronically connected to the logical comparator circuit and receives a first logical comparator output voltage and the second logical comparator output voltage to perform a first logical operation which is used at least in part to generate a power on reset voltage that resets the memory circuit in response to the output voltage drop from the power supply circuit.

2. The electronic device of claim 1, wherein the first memory output voltage has an opposite binary value from the second memory output voltage as the first memory output voltage and the second memory output voltage causes the first logical comparator output voltage and the second logical comparator output voltage to output a same first binary value when the power supply operates normally without the power loss.

3. The electronic device of claim 2, wherein when the power supply experiences the power loss caused by the output voltage drop from the power supply circuit, at least one of the first logical comparator output voltage and the second logical comparator output voltage outputs a second binary value which is opposite to the first binary value.

4. The electronic device of claim 3, wherein the first logical operation comprises a NAND operation performed by a first logical operating circuit which outputs the second binary value when the power supply operates normally without the power loss but outputs the first binary value when the power supply experiences the power loss caused by the output voltage drop from the power supply circuit.

5. The electronic device of claim 4, wherein the logical comparator circuit further comprises:
   a third logical comparator which compares a third memory output voltage with the first power supply voltage received from the power supply circuit to generate a third logical comparator output voltage;
   a fourth logical comparator which compares a fourth memory output voltage with the second power supply voltage to generate a fourth logical comparator output voltage; and
   a second logical operating circuit which receives the third logical comparator output voltage and the fourth logical comparator output voltage to perform a second logic operation which is a NAND operation on the third logical comparator output voltage and the fourth logical comparator output voltage.

6. The electronic device of claim 5, wherein the logical circuit further comprises a third logical operating circuit which receives the NAND operation of the first logical operating circuit and also the NAND operation of the second logical operating circuit to perform a third logical operation to generate the power on reset voltage.

7. The electronic device of claim 6, wherein the third logical operation is an OR operation.

8. The electronic device of claim 1, wherein the first power supply voltage received from the power supply circuit is a reference voltage, and the second power supply voltage received from the power supply circuit is an operating voltage relative to the reference voltage.

9. The electronic device of claim 1, wherein the first memory element of the memory circuit is a dummy memory element which is used exclusively by the electrical circuit.

10. The electronic device of claim 1, wherein the first memory element is a first SR flip-flop which is set by a power up reset and the second memory element is a second SR flip-flop which is reset by a powerup reset.

11. An electrical circuit for recovering from a power loss, the circuit comprising:
    a memory circuit which comprises a first memory element outputting a first memory output voltage and a second memory element outputting a second memory output voltage;

a logical comparator circuit which is electrically connected to the memory circuit and comprises a first logical comparator which compares the first memory output voltage with a first power supply voltage to generate a first logical comparator output voltage and a second logical comparator which compares the second memory output voltage with a second power supply voltage to generate a second logical comparator output voltage; and a logical circuit which is electronically connected to the logical comparator circuit and receives the first logical comparator output voltage and the second logical comparator output voltage to perform a first logical operation which is used at least in part to generate a power on reset voltage.

12. The circuit of claim 11, wherein the first memory output voltage has an opposite binary value from the second memory output voltage as the first memory output voltage and the second memory output voltage causes the first logical comparator output voltage and the second logical comparator output voltage to output a same first binary value under a normal operating condition which is without the power loss.

13. The circuit of claim 12, wherein in response to the power loss, at least one of the first logical comparator output voltage and the second logical comparator output voltage outputs a second binary value which is opposite to the first binary value.

14. The circuit of claim 13, wherein the first logical operation comprises a NAND operation performed by a first logical operating circuit which outputs the second binary value under the normal operating condition but outputs the first binary value in response to the power loss.

15. The circuit of claim 14, wherein the logical comparator circuit further comprises:

a third logical comparator which compares a third memory output voltage with the first power supply voltage received from the power supply circuit to generate a third logical comparator output voltage;

a fourth logical comparator which compares a fourth memory output voltage with the second power supply voltage to generate a fourth logical comparator output voltage; and a second logical operating circuit which receives the third logical comparator output voltage and the fourth logical comparator output voltage to perform a second logic operation which is a NAND operation on the third logical comparator output voltage and the fourth logical comparator output voltage.

16. The circuit of claim 15, wherein the logical circuit further comprises a third logical operating circuit which receives the NAND operation of the first logical operating circuit and also the NAND operation of the second logical operating circuit to perform a third logical operation to generate the power on reset voltage, wherein the third logic operation is an OR operation.

17. A method used by an electronic device for recovering a power loss of a power supply circuit of the electronic device, the method comprising:

receiving from a first memory element a first memory output voltage and from a second memory element a second memory output voltage;

comparing the first memory output voltage with a first power supply voltage received from the power supply circuit to generate a first logical comparator output voltage; comparing the second memory output voltage with a second power supply voltage, which is received from the power supply circuit and is higher than the first power supply voltage, to generate a second logical comparator output voltage;

performing a first logical operation by using the first logical comparator output voltage and the second logical comparator output voltage; and generating a power on reset voltage based at least in part on the first logical operation for resetting the power supply in response to the power loss of the power supply.

18. The method of claim 17, wherein the first memory output voltage has an opposite binary value from the second memory output voltage as the first memory output voltage and the second memory output voltage causes the first logical comparator output voltage and the second logical comparator output voltage to output a same first binary value when the power supply operates normally without the power loss.

19. The method of claim 18, wherein when the power supply experiences the power loss caused by the output voltage drop from the power supply circuit, at least one of the first logical comparator output voltage and the second logical comparator output voltage outputs a second binary value which is opposite to the first binary value.

20. The method of claim 19, wherein the first logical operation comprises a NAND operation which outputs the second binary value when the power supply operates normally without the power loss but outputs the first binary value when the power supply experiences the power loss caused by the output voltage drop from the power supply circuit.

* * * * *